(12) United States Patent
Roth et al.

(10) Patent No.: US 11,698,544 B2
(45) Date of Patent: Jul. 11, 2023

(54) DISSIPATING HEAT FROM AN ACTIVE REGION OF AN OPTICAL DEVICE

(71) Applicant: OpenLight Photonics, Inc., Goleta, CA (US)

(72) Inventors: Jonathan Edgar Roth, San Francisco, CA (US); Erik Norberg, Santa Barbara, CA (US)

(73) Assignee: OpenLight Photonics, Inc., Goleta, CA (US)

( * ) Notice: Subject to any disclaimer, the term of this patent is extended or adjusted under 35 U.S.C. 154(b) by 0 days.

(21) Appl. No.: 17/864,591

(22) Filed: Jul. 14, 2022

(65) Prior Publication Data

US 2022/0350180 A1 Nov. 3, 2022

Related U.S. Application Data

(63) Continuation of application No. 17/032,637, filed on Sep. 25, 2020, now Pat. No. 11,409,141, which is a
(Continued)

(51) Int. Cl.
*G02F 1/025* (2006.01)
*G02F 1/017* (2006.01)
(Continued)

(52) U.S. Cl.
CPC .......... *G02F 1/025* (2013.01); *G02B 6/12002* (2013.01); *G02B 6/1228* (2013.01);
(Continued)

(58) Field of Classification Search
CPC ...... G02F 1/0018; G02F 1/0102; G02F 1/011; G02F 1/0121; G02F 1/0147;
(Continued)

(56) References Cited

U.S. PATENT DOCUMENTS 7,050,689 B2  5/2006  Wipiejewski et al.
10,809,548 B2  10/2020  Roth et al.
(Continued)

FOREIGN PATENT DOCUMENTS

CN   113050304 A   6/2021
JP   H05291695 A   11/1993
(Continued)

OTHER PUBLICATIONS

"U.S. Appl. No. 16/728,999, Response filed Nov. 22, 2022 to Restriction Requirement dated Sep. 22, 2022", 8 pgs.
(Continued)

*Primary Examiner* — Michael P Mooney
(74) *Attorney, Agent, or Firm* — Schwegman Lundberg & Woessner, P.A.

(57) ABSTRACT

A device, such as an electroabsorption modulator, can modulate a light intensity by controllably absorbing a selectable fraction of the light. The device can include a substrate. A waveguide positioned on the substrate can guide light. An active region positioned on the waveguide can receive guided light from the waveguide, absorb a fraction of the received light, and return a complementary fraction of the received light to the waveguide. Such absorption produces heat, mostly at an input portion of the active region. The input portion of the active region can be thermally coupled to the substrate, which can dissipate heat from the input portion, and can help avoid thermal runaway of the device. The active region can be thermally isolated from the substrate away from the input portion, which can maintain a relatively low thermal mass for the active region, and can increase efficiency when heating the active region.

20 Claims, 4 Drawing Sheets

Related U.S. Application Data continuation of application No. 15/685,374, filed on Aug. 24, 2017, now Pat. No. 10,809,548.

(60) Provisional application No. 62/413,077, filed on Oct. 26, 2016.

(51) Int. Cl.

| | | |
|---|---|---|
| *G02F 1/00* | (2006.01) | |
| *G02B 6/12* | (2006.01) | |
| *G02F 1/01* | (2006.01) | |
| *G02B 6/136* | (2006.01) | |
| *G02B 6/122* | (2006.01) | |
| *B82Y 20/00* | (2011.01) | |
| *H01L 31/0352* | (2006.01) | |
| *H01L 31/024* | (2014.01) | |

(52) U.S. Cl.
CPC ........... *G02B 6/136* (2013.01); *G02F 1/0018* (2013.01); *G02F 1/0121* (2013.01); *G02F 1/0147* (2013.01); *G02F 1/01708* (2013.01); *B82Y 20/00* (2013.01); *G02B 2006/12061* (2013.01); *G02B 2006/12078* (2013.01); *G02B 2006/12142* (2013.01); *G02B 2006/12195* (2013.01); *H01L 31/024* (2013.01); *H01L 31/035209* (2013.01)

(58) Field of Classification Search
CPC ........ G02F 1/01708; G02F 1/025; G02F 1/17; G02F 1/225; G02F 1/2257; G02B 6/12002; G02B 6/12004; G02B 6/122; G02B 6/1228; G02B 6/136
See application file for complete search history.

(56) References Cited

U.S. PATENT DOCUMENTS

| | | | |
|---|---|---|---|
| 11,409,141 | B2 | 8/2022 | Roth et al. |
| 2004/0028099 | A1 | 2/2004 | Hongo et al. |
| 2004/0090659 | A1 | 5/2004 | Zhang et al. |
| 2004/0109658 | A1* | 6/2004 | Wipiejewski ........... G02F 1/025 385/129 |
| 2012/0269215 | A1 | 10/2012 | Lv |
| 2014/0254978 | A1 | 9/2014 | Koch et al. |
| 2016/0377953 | A1 | 12/2016 | Feng et al. |
| 2017/0351124 | A1 | 12/2017 | Roth et al. |
| 2018/0149890 | A1 | 5/2018 | Cal et al. |
| 2021/0018769 | A1 | 1/2021 | Roth et al. |
| 2021/0203126 | A1 | 7/2021 | Parker |

FOREIGN PATENT DOCUMENTS

| | | |
|---|---|---|
| KR | 20170071985 A | 6/2017 |
| KR | 20180028331 A | 3/2018 |
| KR | 20190071827 A | 6/2019 |
| TW | 200703830 A | 1/2007 |
| TW | 201331990 A | 8/2013 |
| TW | 202125844 A | 7/2021 |
| WO | WO-2018007824 A1 | 1/2018 |
| WO | WO-2018132158 A1 | 7/2018 |

OTHER PUBLICATIONS

"U.S. Appl. No. 16/728,999, Restriction Requirement dated Sep. 22, 2022", 7 pgs.
"European Application Serial No. 20165828.3, Extended European Search Report dated Sep. 9, 2020", 7 pgs.
"Korean Application Serial No. 10-2020-0035503, Notice of Preliminary Rejection dated Apr. 26, 2021", With English translation, 15 pages.
"Korean Application Serial No. 10-2020-0035503, Response filed Jun. 28, 2021 to Notice of Preliminary Rejection dated Apr. 26, 2021", With English claims, 39 pages.
"Taiwanese Application Serial No. 109106895, Decision of Rejection dated Oct. 28, 2021", With English machine translation, 11 pgs.
"Taiwanese Application Serial No. 201780070552.1, First Office Action dated Jul. 22, 2021", With English translation, 14 pages.
U.S. Appl. No. 15/685,374, U.S. Pat. No. 10,809,548, filed Aug. 24, 2017, Dissipating Heat From an Active Region of an Optical Device.
U.S. Appl. No. 17/032,637, filed Sep. 25, 2020, Dissipating Heat From an Active Region of an Optical Device.
"U.S. Appl. No. 15/685,374, Notice of Allowance dated Jun. 17, 2020", 10 pgs.
"U.S. Appl. No. 15/685,374, Response filed Apr. 6, 2020 to Restriction Requirement dated Feb. 6, 2020", 8 pgs.
"U.S. Appl. No. 15/685,374, Restriction Requirement dated Feb. 6, 2020", 7 pgs.
"U.S. Appl. No. 17/032,637, Non Final Office Action dated Dec. 9, 2021", 7 pgs.
"U.S. Appl. No. 17/032,637, Notice of Allowance dated Apr. 4, 2022", 8 pgs.
"U.S. Appl. No. 17/032,637, Response filed Mar. 9, 2022 to Non Final Office Action dated Dec. 9, 2021", 9 pgs.
"U.S. Appl. No. 17/032,637, Response filed Nov. 19, 2021 to Restriction Requirement dated Sep. 30, 2021", 5 pgs.
"U.S. Appl. No. 17/032,637, Restriction Requirement dated Sep. 30, 2021", 6 pgs.
"European Application Serial No. 20165828.3, Communication Pursuant to Article 94(3) EPC dated Jan. 17, 2023", 4 pgs.
"Taiwanese Application Serial No. 109106895, Office Action dated Jan. 10, 2023", With English machine translation, 13 pgs.

* cited by examiner

DISSIPATING HEAT FROM AN ACTIVE REGION OF AN OPTICAL DEVICE

CROSS-REFERENCE TO RELATED APPLICATION

This application is a continuation of U.S. patent application Ser. No. 17/032,637, filed Sep. 25, 2020, which is a continuation of U.S. patent application Ser. No. 15/685,374, filed Aug. 24, 2017, which claims the benefit of U.S. Provisional Application No. 62/413,077, filed on Oct. 26, 2016, the contents of which are incorporated by reference herein in their entirety.

TECHNICAL FIELD

The present disclosure relates to controllably dissipating heat in an active region of an optical device.

BACKGROUND

A device, such as an electroabsorption modulator, can modulate a light intensity by controllably absorbing a selectable fraction of the light. Such absorption can produce heat. It is desirable to dissipate heat caused by the light absorption.

BRIEF DESCRIPTION OF THE DRAWINGS

In the following detailed description of example embodiments of the invention, reference is made to the accompanying drawings which form a part hereof, and which is shown by way of illustration only, specific embodiments in which the invention may be practiced. It is to be understood that other embodiments may be utilized and structural changes may be made without departing from the scope of the present invention.

Corresponding reference characters indicate corresponding parts throughout the several views. Elements in the drawings are not necessarily drawn to scale. The configurations shown in the drawings are merely examples, and should not be construed as limiting the scope of the invention in any manner.

DETAILED DESCRIPTION

Figure 1:
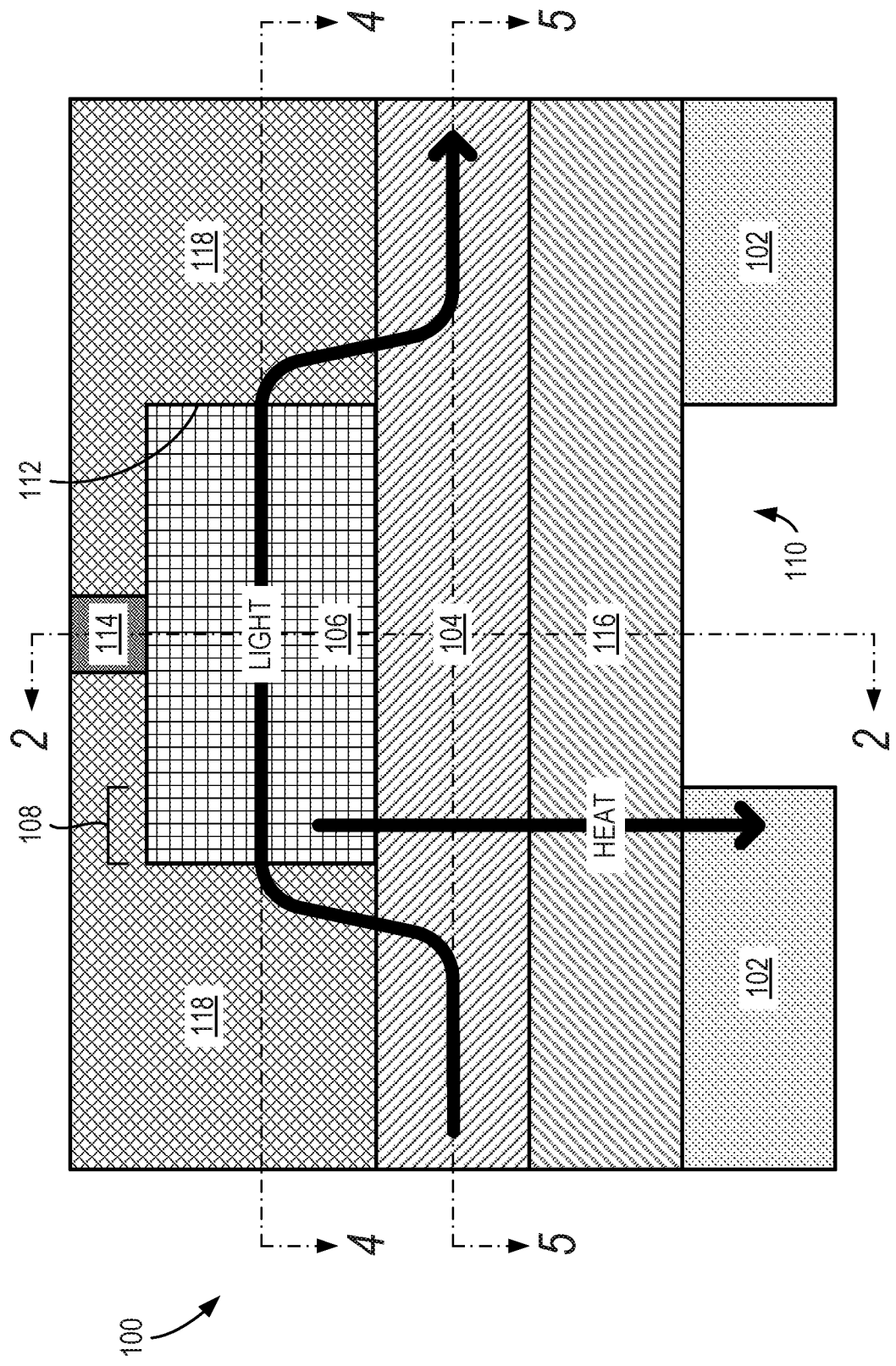
FIG. 1 shows a cross-section of an example of a device, in which light propagates within the plane of the figure, in accordance with some embodiments.

A device, such as an electroabsorption modulator, can modulate a light intensity by controllably absorbing a selectable fraction of the light. In a typical, known configuration of an electroabsorption modulator, an active region can absorb a particular percentage of the light per unit length of the active region. As a result, the known device can show a relatively large absorption near an input portion of the active region, which can decrease to a relatively small absorption near an output portion of the active region.

The active region generates heat where the absorption occurs. Consequently, because the input portion of the active region absorbs the most light, the input portion produces most of the heat generated by the active region.

To further complicate use of the known electroabsorption modulator, the active region may be formed from a material that increases absorption as the temperature increases. As a result, the input portion of the active region can absorb even more light, and increase its temperature even more. In some instance, this can lead to thermal runaway of the electroabsorption modulator, which is undesirable and can damage the active region and other components in the electroabsorption modulator.

One solution for dissipating the heat from the active region is to thermally couple the full active region to a heat sink, such as a substrate that can dissipate the heat over a relatively large area. A drawback to heat sinking the full active region is that it can increase a thermal mass of the active region. Such an increase in thermal mass can make it more difficult to change the temperature of the active region. For an electroabsorption modulator that uses a heater to controllably change the temperature, the increase in thermal mass can result in slower performance for a given heater, or can require use of a more powerful heater to maintain a particular modulator speed. Both of these cases are undesirable.

A better solution is to dissipate the heat produced in the input portion of the active region, where most of the heat is generated, while thermally isolating the remainder of the active region. In such a solution, the input portion of the active region can be thermally coupled to the substrate, which can dissipate heat from the input portion, and can help avoid thermal runaway of the device. Furthermore, in such a solution, the active region can be thermally isolated from the substrate away from the input portion, which can maintain a relatively low thermal mass for the active region, and can increase efficiency when heating the active region. The discussion that follows includes several mechanisms for dissipating the heat in just the input portion of the active region.

One example of a device, such as an electroabsorption modulator, can include a substrate. A waveguide can be positioned on the substrate and can guide light. An active region can be positioned on the waveguide and can receive guided light from the waveguide, absorb a fraction of the received light, and return a complementary fraction of the received light to the waveguide. The active region can include an input portion that can receive the guided light. The active region can be thermally coupled to the substrate in the input portion and can be thermally isolated from the substrate away from the input portion.

In some examples, the device can use air as a thermal insulator, and can use one or more particular etched portions of the substrate to provide thermal isolation from the substrate material. For these examples, the substrate can be etched to form an etched portion. The etched portion can extend under the waveguide from the input portion of the active region to an output end of the active region such that the etched portion thermally isolates the active region from the substrate. The etched portion of the substrate may not extend under the input portion of the active region such that the active region is thermally coupled to the substrate in the input portion.

The preceding paragraphs are merely a summary of the subject matter that follows, and should be not be construed as limiting in any way. The following discussion provides additional details regarding configurations of the device.

Figure 2:
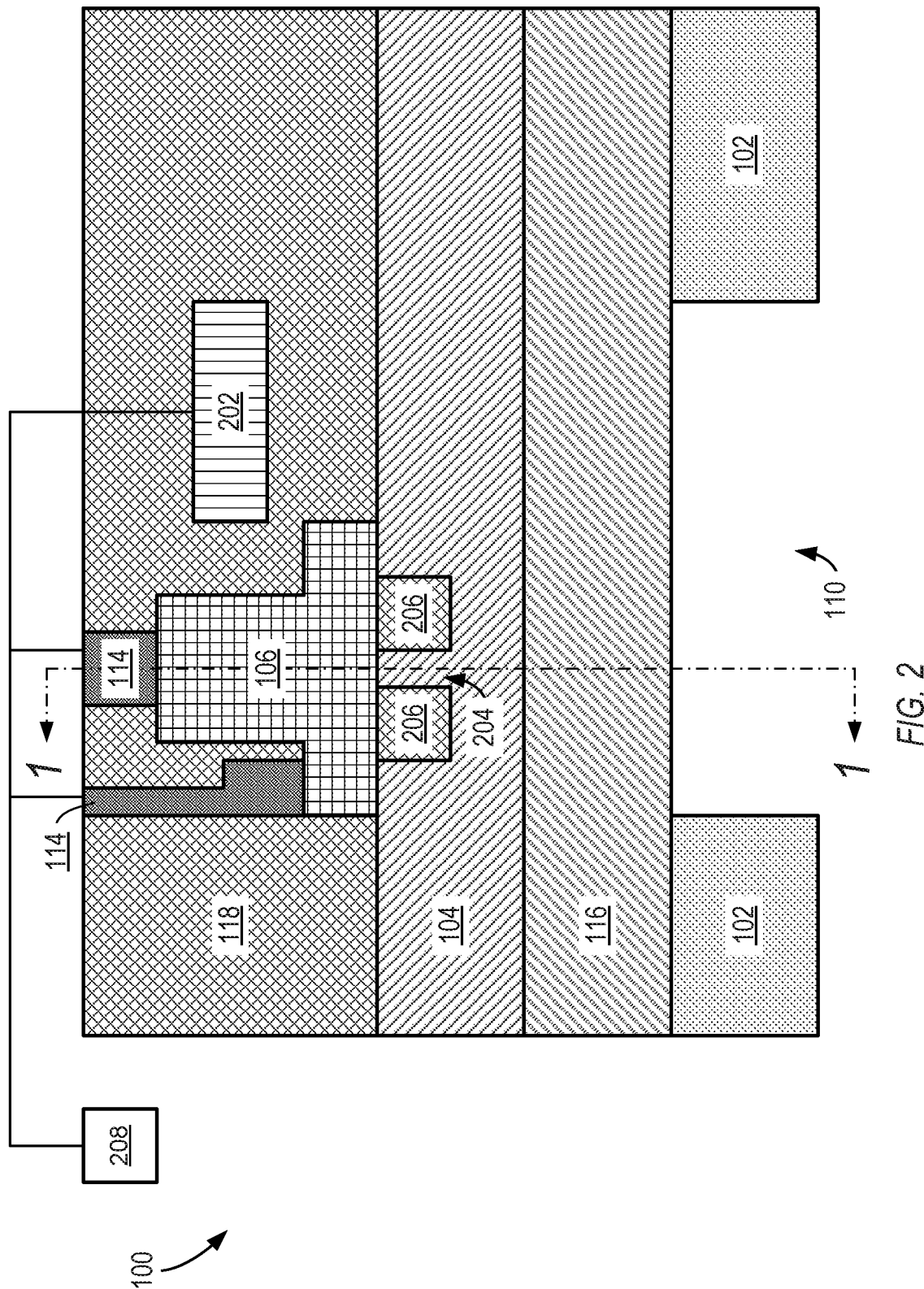
FIG. 2 shows another cross-section of the device of FIG. 1, where light propagates into or out of the plane of the figure, in accordance with some embodiments.

FIG. 1 shows a cross-section of an example of a device 100, in which light propagates within the plane of the figure, in accordance with some embodiments. FIG. 2 shows another cross-section of the device 100 of FIG. where light propagates into or out of the plane of the figure, in accordance with some embodiments. In some examples, the device 100 can function as an electroabsorption modulator. This is but one configuration of such a device; other configurations can also be used.

The device 100 can include a substrate 102. The substrate 102 can be formed from silicon, from a semiconductor material, or from any other suitable material. In some examples, the device 100 can be formed using semiconductor techniques to deposit or grow the various elements as layers on the substrate 102. In the cross-sectional views of FIGS. 1 and 2, the substrate 102 is shown toward the bottom of the figures, and additional layers or elements are shown above the substrate 102. For the purposes of this document, the additional layers or elements are referred to as being "on" the substrate 102 or "under" particular structures, such as waveguides. Such a designation is used for convenience, and is not intended to imply that the device 100 or any of its elements have a particular orientation during manufacturing, storage, or use.

In addition, in the cross-sectional view of FIG. 1, light travels generally from left to right as it propagates through the device 100. For the purposes of this document, the directions shown in the figures are pictured in this manner strictly for convenience. The figures are not intended to imply that light in the device 100 travels along a particular direction during use.

A waveguide 104 can be positioned on the substrate 102 and can guide light. In some examples, the waveguide 104 can be formed as a silicon path or trench within a layered structure. The silicon path or trench can be surrounded by one or more non-silicon materials in the layered structure, so that light remains confined within the waveguide 104. The silicon path or trench can have a cross-sectional shape suitable for propagating light.

An active region 106 can be positioned on the waveguide 104. The active region 106 can receive guided light from the waveguide 104, can absorb a first fraction of the received light, and can return a second fraction of the received light to the waveguide 104. In some examples, the first fraction and the second fraction can be complementary, so that the first and second fractions sum to 100%, or can sum to a value less than 100%. In some examples, the active region 106 can include a III-V semiconductor material having an absorption spectrum that is variable in response to applied heat and an applied electric field. In some examples, the III-V semiconductor material can use one of the quantum-confined Stark effect or the Franz-Keldysh effect. In some examples, an absorption of the semiconductor material can increase with increasing temperature.

Figure 4:
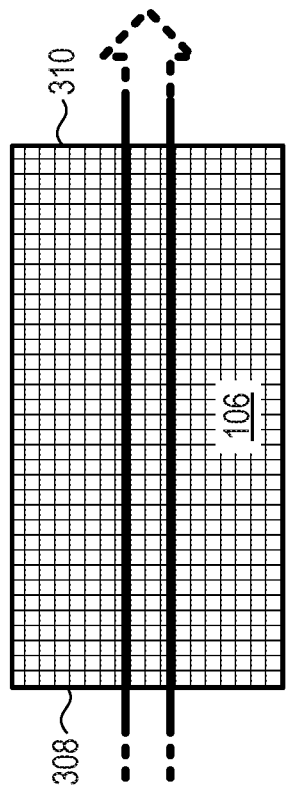
FIG. 4 shows a cross-sectional view of the active region of FIGS. 1-3, in accordance with some embodiments.
Figure 5:
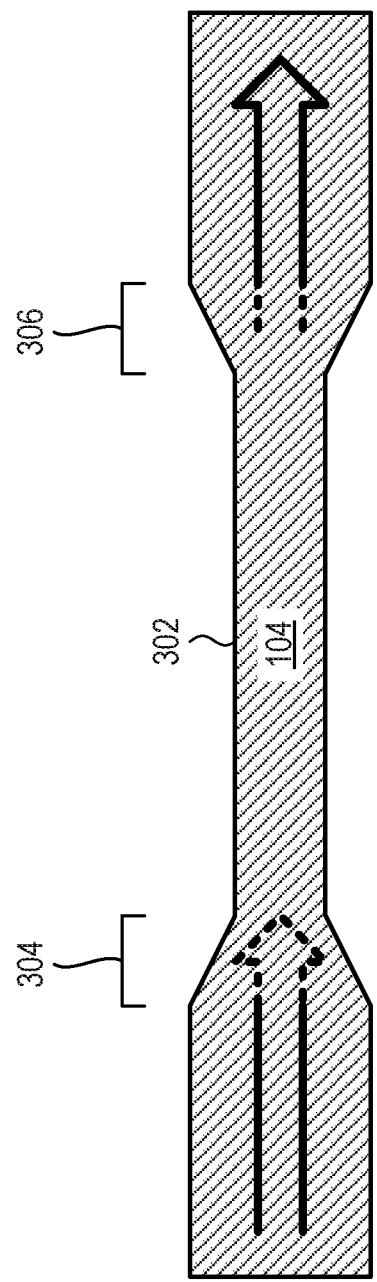
FIG. 5 shows a cross-section view of the waveguide of FIGS. 1-3, in accordance with some embodiments.
Figure 3:
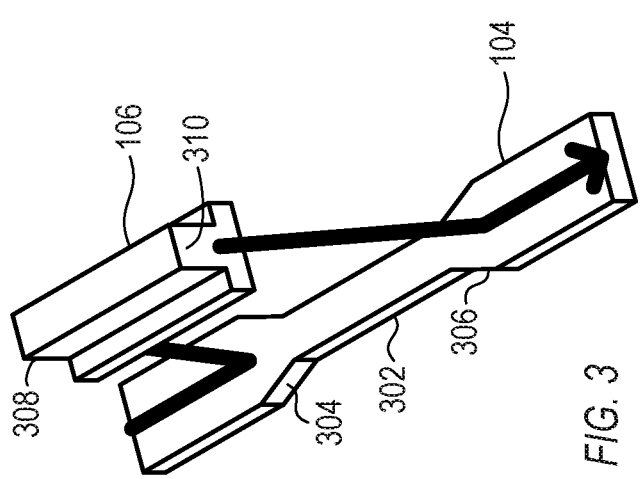
FIG. 3 shows an exploded view of the waveguide and the active region of FIGS. 1 and 2, in accordance with some embodiments.

FIG. 3 shows an exploded view of the waveguide 104 and the active region 106 of FIGS. 1 and 2, in accordance with some embodiments. FIG. 4 shows a cross-sectional view of the active region 106 of FIGS. 1-3, in accordance with some embodiments. FIG. 5 shows a cross-section view of the waveguide 104 of FIGS. 1-3, in accordance with some embodiments. FIGS. 3-5 are intended to complement and clarify the geometry of the waveguide 104 and the active region 106 shown in FIGS. 1 and 2.

The waveguide 104 can taper to a narrowed portion 302 at a first taper 304 and can widen from the narrowed portion 302 at a second taper 306. In some examples, the active region 106 can be parallel to and adjacent the narrowed portion 302. The active region 106 can receive guided light from the waveguide 104 at the first taper 304. The active region 106 can absorb a fraction of the received light as the light propagates along the active region 106. The absorption (and therefore, the generated heat) can decrease from an input end 308 of the active region 106 to an output end 310 of the active region 106. The active region 106 can return a complementary fraction of the received light to the waveguide 104 at the second taper 306.

The geometry of FIGS. 3-5 is intended to show a general behavior of light propagating through the waveguide 104 and the active region 106, where light propagates from the waveguide 104 to the active region 106, then returns to the waveguide 104. There are additional configurations discussed below, in which one or more specific portions of the waveguide 104 and/or the active region 106 can be varied in size, shape, and/or relative orientation. The present discussion below returns to FIG. 1.

The active region 106 can include an input portion 108 that can receive the guided light. The active region 106 can be thermally coupled to the substrate 102 in the input portion 108 and can be thermally isolated from the substrate 102 away from the input portion 108.

In some examples, the device 100 can use air to perform thermal isolation, because air has a thermal conductivity less than the thermal conductivity of most solid materials. For example, the substrate 102 can be etched to form an etched portion 110. The etched portion 110 can extend under the waveguide 104 from the input portion 108 of the active region 106 to an output end 112 of the active region 106 such that the etched portion 110 can thermally isolate the active region 106 from the substrate 102. The etched portion 110 of the substrate 102 may not extend under the input portion 108 of the active region 106 such that the active region 106 is thermally coupled to the substrate 102 in the input portion 108. In some examples, the etched portion 110 can be designed in a way that tailors a thermal impedance (e.g. a degree of thermal isolation) along a length of the device. For example, a front of the device can include a narrower region of etching, and the etching can widen along a length of the device. In another example, an overlap of the etched portion 110 with a ridge can vary along a length the device. In some examples, a spacing between a heater and the modulator can also vary along a length of the device. Other techniques to dissipate heat can also be used, in addition to or instead of the etching shown in FIG. 1.

In some examples, a heater 202 (FIG. 2) can selectively heat the active region 106. In some examples, heat from the heater 202 can controllably vary the absorption spectrum of the III-V semiconductor material in the active region 106. In some examples, the heater 202 can be an electrically resistive heater. In some examples, the heater 202 can be electrically connected to control circuitry 208 (FIG. 2), which can supply a controllable current to the electrically resistive heater to selectively heat the active region 106. The control circuitry may include one or more hardware processors.

In some examples, a plurality of electrodes 114 can produce an electric field in the active region 106. In some examples, the electric field from the electrodes 114 can controllably vary the absorption spectrum of the III-V semiconductor material in the active region 106. In some examples, the electrodes 114 can be electrically connected to the control circuitry 208, which can supply a selectable voltage to the plurality of electrodes 114 to control a strength of the electric field in the active region 106.

In some examples, the electrodes 114 and the heater 202 can work together to controllably vary the absorption spectrum of the III-V semiconductor material in the active region 106. In some examples, the electrodes 114 can vary the electric field more rapidly than the heater 202 can vary the temperature, so that the heater 202 can vary the absorption spectrum at relatively low frequencies, while the electrodes 114 can vary the absorption spectrum at relatively high frequencies.

In some examples, the control circuitry 208 can be positioned away from the device 100, and can connect to the device 100 through an interface that electrically connects to the electrodes 114 and connects to corresponding electrodes for the heater 202 (not shown).

In some examples, an optional buried oxide layer 116 can be positioned between the substrate 102 and the waveguide 104. The buried oxide layer 116 has a low refractive index relative to silicon and can serve as cladding for an optical mode in the waveguide 104. In some examples, the buried oxide layer 116 can also serve as an etch stop layer for a substrate etch. In some examples, the etched portion 110 of the substrate 102 may extend partially or fully through the buried oxide layer 116. In other examples, the etched portion 110 of the substrate 102 may extend only partially through the substrate 102, and may not reach the buried oxide layer 116.

In some examples, a cladding layer 118 can be formed from a dielectric material, can be positioned directly adjacent the waveguide 104 and the active region 106, and can surround the heater 202.

The following six paragraphs describe additional techniques that can help reduce the risk of damaging the input portion 108 of the active region 106 due to excessive heating. Some of the techniques reduce the amount of light absorbed at the input portion 108, compared with the remainder of the active region 106. Some of the techniques help dissipate the heat generated at the input portion 108 of the active region 106. One of ordinary skill in the art will readily understand these additional techniques from the description below, without the need for additional drawings. All of these additional techniques can be used alone or in any combination. Any and all can optionally be used in addition to or instead of the etching technique discussed above.

In some examples, the control circuitry and electrodes 114 can further provide a first electric field in the input portion 108 of the active region 106 and provide a second electric field, greater than the first electric field, in the active region 106 away from the input portion 108 of the active region 106. Reducing the electric field in the input portion 108 can decrease the fraction of light absorbed in the input portion 108, compared to the fraction of light absorbed in the remainder of the input portion 108. This can allow for an increase in the total amount of light absorbed by the active region 106, without damaging the input portion 108 of the active region 106. Alternatively, the electric field in the input portion 108 can be reduced by performing ion implantation to change the doping junction thickness profile along the device 100. For example, fluorine ions can be used to deactivate silicon doping of InAlGaAs. As a further alternative, resistance can be added to the electrical path, although adding resistance can slow down performance of the device 100.

In some examples, the active region 106 can extend beyond the narrowed portion 302 to at least partially overlap with the first taper 304. Overlapping the first taper 304 in this manner can reduce the amount of light present in the input portion 108. This can decrease the fraction of light absorbed in the input portion 108, compared to the fraction of light absorbed in the remainder of the input portion 108. This can allow for an increase in the total amount of light absorbed by the active region 106, without damaging the input portion 108 of the active region 106.

In some examples, at least one of the plurality of electrodes 114 can be segmented proximate the input portion 108 of the active region 106. This can reduce the electric field in the input portion 108, compared to the remainder of the active region 106. Reducing the electric field in the input portion 108 can decrease the fraction of light absorbed in the input portion 108, compared to the fraction of light absorbed in the remainder of the input portion 108. This can allow for an increase in the total amount of light absorbed by the active region 106, without damaging the input portion 108 of the active region 106. Further, combining the segmented electrodes 114 with extension of the active region 106 into the first taper 304 can be particularly advantageous. Doing so can allow the input portion 108 of the active region 106 to have a lower confinement factor than the remainder of the active region 106. Doing so can also reduce the increase in capacitance that would be caused by extending the active region 106 over the first taper 304 in a single segment.

In some examples, the device 100 can further include at least one silicon rib 204 (FIG. 2) oriented parallel to the active region 106 and positioned between the active region 106 and the etched portion 110 of the substrate 102. Such a silicon rib 204 can conduct heat efficiently along the active region 106, and can redistribute heat away from the input portion 108 to the remainder of the active region 106. The at least one silicon rib 204 can have a cross-sectional size that is smaller than a wavelength of the guided light. Using such a small rib 204 can ensure that the rib does not affect an optical performance of the active region 106. Specifically, using such a small rib 204 can may not appreciably affect a confinement of the light within the active region 106. The silicon rib 204 can be formed by etching trenches 206 in the silicon waveguide 104 on either side of the rib 204, then filling the trenches 206 with a dielectric material. The active region 106 can be formed directly on the silicon rib 204 and the filled trenches 206.

In some examples, the device 100 can further include a metallic thermal shunt positioned at least partially on the input portion of the active region. Such a metallic thermal shunt can conduct heat efficiently away from the input portion 108 of the active region 106. This can enhance the heat dissipation provided by the overlap of the substrate 102 with the input portion 108 of the active region 106.

In some examples, the active region 106 can have a cross-sectional size that is larger at the input portion 108 of the active region 106 than the output end 112 of the active region 106. Expanding the size of the input portion 108 can decrease the peak power dissipation per unit volume at the input portion 108, which can help prevent damage to the input portion 108.

The preceding six paragraphs describe additional techniques that can help reduce the risk of damaging the input portion 108 of the active region 106 due to excessive heating. Any and all can optionally be used alone, in any combination with one another, or in addition to or instead of the etching technique discussed above.

Figure 6:
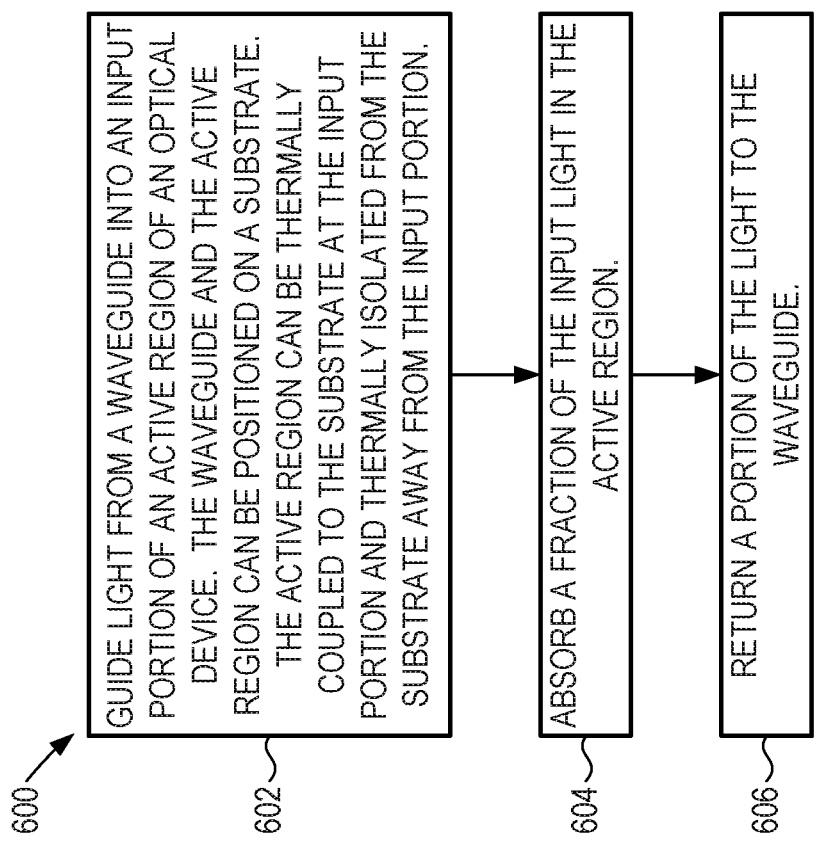
FIG. 6 shows an example of a method for dissipating heat from an active region of an optical device, in accordance with some embodiments.

FIG. 6 shows an example of a method 600 for dissipating heat from an active region of an optical device, in accordance with some embodiments. The method 600 can be executed on the device 100 shown in FIGS. 1 and 2, which can optionally include any or all of the additional techniques described above for reducing the risk of damaging the input portion of the active region due to excessive heating. This is but one method for dissipating heat from an active region of an optical device; other suitable methods can also be used.

At operation 602, the device can guide light from a waveguide into an input portion of an active region of an optical device. The waveguide and the active region can be positioned on a substrate. The active region can be thermally coupled to the substrate at the input portion and thermally isolated from the substrate away from the input portion.

At operation 604, the device can absorb a fraction of the input light in the active region.

At operation 606, the device can return a portion of the light to the waveguide.

In some examples, the substrate can be etched to form an etched portion. In some examples, the etched portion can extend under the waveguide from the input portion of the active region to an output end of the active region, such that the etched portion thermally isolates the active region from the substrate. In some examples, the etched portion of the substrate may not extend under the input portion of the active region, such that the waveguide is thermally coupled to the active region at the input portion.

In some examples, the method 600 can further include heating the active region with a heater controlled by control circuitry.

In some examples, the method 600 can further include producing an electric field in the active region with the control circuitry and a plurality of electrodes.

To further illustrate the device and related method disclosed herein, a non-limiting list of examples is provided below. Each of the following non-limiting examples can stand on its own, or can be combined in any permutation or combination with any one or more of the other examples.

In Example 1, an optical device can include a substrate; a waveguide positioned on the substrate and configured to guide light; and an active region positioned on the waveguide and including an input portion that is configured to receive guided light from the waveguide, the active region configured to absorb a first fraction of the received light and return a second fraction of the received light to the waveguide, the active region being thermally coupled to the substrate at the input portion and thermally isolated from the substrate away from the input portion.

In Example 2, the optical device of Example 1 can optionally be configured such that the substrate is etched to form an etched portion; the etched portion extends under the waveguide from the input portion of the active region to an output end of the active region such that the etched portion thermally isolates the active region from the substrate; and the etched portion of the substrate does not extend under the input portion of the active region such that the active region is thermally coupled to the substrate at the input portion.

In Example 3; the optical device of any one of Examples 1-2 can optionally further include a heater configured to heat the active region; a plurality of electrodes configured to produce an electric field in the active region; and control circuitry configured to control the heater to selectively heat the active region, and supply a selectable voltage to the plurality of electrodes to control a strength of the electric field in the active region.

In Example 4, the optical device of any one of Examples 1-3 can optionally be configured such that the active region includes a III-V semiconductor material having an absorption spectrum that is variable in response to the heat from the heater and to the electric field from the electrodes; the III-V semiconductor material uses one of the quantum-confined Stark effect or the Franz-Keldysh effect; and an absorption of the III-V semiconductor material increases with increasing temperature.

In Example 5, the optical device of any one of Examples 1-4 can optionally be configured such that the control circuitry and electrodes are further configured to provide a first electric field in the input portion of the active region and provide a second electric field, greater than the first electric field, in the active region away from the input portion of the active region.

In Example 6, the optical device of any one of Examples 1-5 can optionally be configured such that the waveguide tapers to a narrowed portion at a first taper and widens from the narrowed portion at a second taper; the active region is parallel to and adjacent the narrowed portion; and the active region extends beyond the narrowed portion to at least partially overlap with the first taper.

In Example 7, the optical device of any one of Examples 1-6 can optionally further include at least one of the plurality of electrodes is segmented proximate the input portion of the active region.

In Example 8, the optical device of any one of Examples 1-7 can optionally further include at least one silicon rib oriented parallel to the active region and positioned between the active region and the etched portion of the substrate, the at least one silicon rib having a cross-sectional size that is smaller than a wavelength of the guided light.

In Example 9, the optical device of any one of Examples 1-8 can optionally further include a metallic thermal shunt positioned at least partially on the input portion of the active region.

In Example 10, the optical device of any one of Examples 1-9 can optionally be configured such that the active region has a cross-sectional size that is larger at the input portion of the active region than at an output end of the active region.

In Example 11, the optical device of any one of Examples 1-10 can optionally further include a buried oxide layer positioned between the substrate and the waveguide; and a cladding layer formed from a dielectric material, positioned directly adjacent the waveguide and the active region, and surrounding the heater.

In Example 12, a method can include guiding light from a waveguide into an input portion of an active region of an optical device, the waveguide and the active region positioned on a substrate, the active region being thermally coupled to the substrate at the input portion and thermally isolated from the substrate away from the input portion; absorbing a fraction of the input light in the active region; and returning a portion of the light to the waveguide.

In Example 13, the method of Example 12 can optionally be configured such that the substrate is etched to form an etched portion; the etched portion extends under the waveguide from the input portion of the active region to an output end of the active region, such that the etched portion thermally isolates the active region from the substrate; and the etched portion of the substrate does not extend under the input portion of the active region, such that the waveguide is thermally coupled to the active region at the input portion.

In Example 14, the method of any one of Examples 12-13 can optionally further include heating the active region with a heater controlled by control circuitry.

In Example 15, the method of any one of Examples 12-14 can optionally-further include producing an electric field in the active region with the control circuitry and a plurality of electrodes.

In Example 16, an optical device can include a substrate; a waveguide positioned on the substrate and configured to guide light, the waveguide tapering to a narrowed portion at a first taper and widening from the narrowed portion at a second taper; a buried oxide layer positioned between the substrate and the waveguide; and an active region positioned on the waveguide and including an input portion that is configured to receive guided light from the waveguide at the first taper, the active region configured to absorb a first fraction of the received light and return a second fraction of the received light to the waveguide at the second taper, the substrate being etched to form an etched portion, the etched portion extending under the waveguide from the input portion of the active region to an output end of the active region such that the etched portion thermally isolates the active region from the substrate away from the input portion, the etched portion of the substrate not extending under the input portion of the active region such that the active region is thermally coupled to the substrate at the input portion.

In Example 17, the optical device of Example 16 can optionally further include a heater configured to heat the active region; a plurality of electrodes configured to produce an electric field in the active region; and control circuitry configured to control the heater to selectively heat the active region; and supply a selectable voltage to the plurality of electrodes to control a strength of the electric field in the active region.

In Example 18, the optical device of any one of Examples 16-17 can optionally further include a cladding layer formed from a dielectric material, positioned directly adjacent the waveguide and the active region, and surrounding the heater.

In Example 19, the optical device of any one of Examples 16-18 can optionally be configured such that the active region includes a III-V semiconductor material having an absorption spectrum that is variable in response to applied heat and to the electric field from the electrodes; the III-V semiconductor material uses one of the quantum-confined Stark effect or the Franz-Keldysh effect; and an absorption of the III-V semiconductor material increases with increasing temperature.

In Example 20, the optical device of any one of Examples 16-19 can optionally be configured such that the control circuitry and electrodes are further configured to provide a first electric field in the input portion of the active region and provide a second electric field, greater than the first electric field, in the active region away from the input portion of the active region.

What is claimed is:

1. An optical device, comprising:
   a waveguide layer comprising a waveguide to guide light;
   an active region comprising a coupled portion to couple light in the waveguide; and
   one or more electrodes to provide a first electric field in the coupled portion of the active region and provide a second electric field in portions of the active region away from the coupled portion, the first electric field of the coupled portion being lower than the second electric field to compensate from increased heating at the coupled portion due to coupling of light from the waveguide layer to the active region.

2. The optical device of claim 1, wherein the first electric field is lower than the second electric field due to ions implanted in the coupled portion of the active region.

3. The optical device of claim 2, wherein the ions reduce a doping of active material of the active region.

4. The optical device of claim 2, wherein the ions comprise fluorine ions.

5. The optical device of claim 1, wherein the optical device comprises an oxide layer between the waveguide layer and a substrate layer of the optical device.

6. The optical device of claim 1, wherein the portions of the active region away from the coupled portion are outside the coupled portion.

7. The optical device of claim 1, further comprising:
   a heater configured to heat the active region.

8. The optical device of claim 7, further comprising:
   control circuitry to control the heater to heat the active region.

9. The optical device of claim 1, wherein the optical device further comprises control circuitry to control a supply of voltage to the one or more electrodes.

10. The optical device of claim 1, wherein the active region comprises a III-V semiconductor material having an absorption spectrum that varies in response to heat from a heater.

11. The optical device of claim 10, wherein an absorption of the III-V semiconductor material increases with increasing temperature.

12. The optical device of claim 1, wherein the waveguide tapers to a narrowed portion at a first taper and widens from the narrowed portion at a second taper.

13. The optical device of claim 12, wherein the active region is parallel to and adjacent the narrowed portion.

14. The optical device of claim 13, wherein the active region extends beyond the narrowed portion to partially overlap with the first taper.

15. The optical device of claim 1, wherein at least one of the one or more electrodes is segmented proximate the coupled portion of the active region.

16. The optical device of claim 1, further comprising at least one silicon rib oriented parallel to the active region and positioned between the active region and an etched portion of a substrate layer of the optical device, the at least one silicon rib having a cross-sectional size that is smaller than a wavelength of the guided light.

17. A method, comprising:
   guiding light in a waveguide of a waveguide layer of an optical device;
   coupling light to a coupled portion of an active region of the optical device;
   providing, using one or more electrodes of the optical device, a first electric field and a second electric field to the active region, the first electric field provided to the coupled portion of the active region, the second electric field provided to portions of the active region away from the coupled portion, the first electric field of the coupled portion being lower than the second electric field to compensate from increased heating at the coupled portion due to coupling of light from the waveguide layer to the active region.

18. The method of claim 17, wherein the first electric field is lower than the second electric field due to ions implanted in the coupled portion of the active region.

19. The method of claim 18, wherein the ions reduce a doping of active material of the active region.

20. The method of claim 18, wherein the ions comprise fluorine ions.

* * * * *